(12) United States Patent
Koning et al.

(10) Patent No.: US 8,624,478 B2
(45) Date of Patent: Jan. 7, 2014

(54) HIGH VOLTAGE SHIELDING ARRANGEMENT OF A CHARGED PARTICLE LITHOGRAPHY SYSTEM

(75) Inventors: Johan Joost Koning, The Hague (NL); Stijn Willem Herman Steenbrink, The Hague (NL); Norman Hendrikus Rudolf Baars, Eindhoven (NL); Bart Schipper, Nijkerk (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 12/898,665

(22) Filed: Oct. 5, 2010

(65) Prior Publication Data
US 2011/0084592 A1   Apr. 14, 2011

Related U.S. Application Data

(60) Provisional application No. 61/250,338, filed on Oct. 9, 2009.

(51) Int. Cl.
 *H01J 1/52* (2006.01)
 *H01J 37/30* (2006.01)
 *H01J 37/04* (2006.01)

(52) U.S. Cl.
 USPC ...... 313/313; 313/239; 250/396 R; 250/492.2

(58) Field of Classification Search
 USPC ................. 313/313, 239, 231.11; 333/33; 174/31 R; 361/302
 See application file for complete search history.

(56) References Cited

U.S. PATENT DOCUMENTS

| | | | | |
|---|---|---|---|---|
| 3,416,207 A | * | 12/1968 | Maida | 29/25.42 |
| 3,808,478 A | * | 4/1974 | Winkler | 361/302 |
| 4,858,064 A | * | 8/1989 | Segawa et al. | 361/302 |
| 6,510,038 B1 | * | 1/2003 | Satou et al. | 361/302 |

FOREIGN PATENT DOCUMENTS

| | | |
|---|---|---|
| JP | 2007-266525 | 10/2007 |
| NL | 2003619 | 10/2009 |
| WO | WO 2006/004374 A1 | 1/2006 |
| WO | WO 2011/043668 A1 | 4/2011 |

* cited by examiner

*Primary Examiner* — Karabi Guharay
(74) *Attorney, Agent, or Firm* — Blakely Sokoloff Taylor & Zafman

(57) ABSTRACT

The invention relates to a high voltage shielding arrangement comprising a first metal part and a second metal part positioned in close vicinity to said first metal part. Said second metal part included in said arrangement to be set at an electrical potential that is lower than the electric potential of the first metal part. Said second metal part having comprising one or more edges and an insulator. The second metal part is at least partially encapsulated by the insulator facing the first metal part.

12 Claims, 3 Drawing Sheets

US 8,624,478 B2

HIGH VOLTAGE SHIELDING ARRANGEMENT OF A CHARGED PARTICLE LITHOGRAPHY SYSTEM

This is a non-provisional application claiming the benefit of U.S. Provisional Application No. 61/250,338, filed Oct. 9, 2009.

BACKGROUND

1. Field of the Invention

The present invention relates to a high voltage shielding design as defined by the preamble of claim 1, and particularly originates from a desire and requirement to apply known high voltage technology in a modern charged particle lithography system.

Such shielding designs are generally encountered in the art of high voltage engineering. In known constructions this is often realized by placing positive and negative poles of an electrical circuit at a certain and fairly large distance apart to prevent electrical breakdown. In other solutions the electric discharge path is elongated, e.g. by providing undulations and other kind of irregularities in said path.

Both known types of solution in practice lead to either or both of a voluminous and an elaborate construction. This is in particular in the technologically highly intensive, and therefore cost and capital intensive environment of lithography highly undesired. It is therefore an object of the present invention to realize a considerably less space consuming and/or a relatively simple shielding design, in particular for enabling high voltage parts in a lithographic environment, more in particular within a charged particle lithography machine.

2. Prior Art

Such a shielding design is particularly suited for, but not limited to, use in charged particle beam projection systems for maskless lithography. Such systems are generally known and have the advantage of fabrication on demand and possibly lower tool cost, due to a lack in necessity to use, change and install masks. One example of such a system, disclosed in WO2007/013802, comprises a charged particle column operating in a vacuum chamber with a charged particle source including a charged particle extraction means, a means for creating a plurality of parallel beamlets from said extracted charged particles and a plurality of electrostatic lens structures comprising electrodes. The electrostatic lenses serve the purpose of focusing and blanking the beamlets, where blanking is realized by deflecting one or a multiplicity of such charged particle beams to prevent the particle beam or multiplicity of beamlets from reaching the target such as a wafer. For realizing the final part of the projection on said target of a computer based image pattern non blanked beamlets are, at a final set of such electrostatic lenses projected onto said target.

Said charged particle column also requires a multiplicity of electrical leads to be fed to the column as to provide signal access. For providing said signal access to the vacuum chamber it is generally necessary to provide feed-throughs which pass said electrical leads through the vacuum chamber wall for providing a electric coupling between the vacuum chamber and the outside environment. Said electrical leads may be required to supply and sustain high voltage signals.

Where high voltage, usually an electric potential of more than 1 kV, is used, it is generally necessary to provide sufficient electrical insulation and shielding to prevent the high voltage signals from either electric breakdown or causing electron creep to occur.

Electrical breakdown occurs when the electric potential between the positive and negative poles is sufficiently high that the electric field generated causes a discharge from one pole to another through a space separating the poles.

Electron creep occurs when individual electrons migrate across a surface in between the positive and negative poles, said electrons being effectively extracted from the negative pole. This effect becomes more notable as the electric potential increases to higher values or when the metal parts are very thin, such as is the case when conductive coatings are used.

Both these phenomena are more likely to occur when field enhancement occurs, as an effect of the geometric configuration of the electric field. Where the electric field and corresponding electric field lines, or equipotential lines, are normally evenly spaced resulting in a constant and uniform field strength, distortions in the field geometry caused for instance by protrusions or sharp edges effectively push the equipotential lines together, locally increasing the strength of the electric field. This increased strength of the electric field will increase the likelihood of electrical breakdown and electron creep. In a typical application the electric field may reach 10 kV/mm, whilst in certain high-performance charged particle applications systems field strengths of up to 30 kV/mm occur.

To prevent the occurrence of the previously mentioned phenomena commonly a large enough distance is maintained between both poles to prevent breakdown, meaning that such a shielding design inherently is of a large size. This size disadvantage may be evident in spacing the poles apart in a planar fashion and resulting in a large diameter, meaning that for instance ports in a vacuum chamber need to be larger than desired. Alternatively, such a shielding design can space the poles perpendicular to the plane, resulting in an increase in volume occupied by the shielding.

One such practically embodied shielding design is known from U.S. Pat. No. 4,231,003 wherein a coaxial vacuum feedthrough is disclosed. The known feedthrough comprises a first round metal bar with one vacuum end and one atmosphere end for connecting an external and an internal wire. The metal pin is enclosed by a first ceramic cylinder which in turn is enclosed in an airtight manner by a first metal cylinder. A second ceramic cylinder encloses the first metal cylinder. A second metal cylinder airtightly encloses the second ceramic cylinder and is airtightly fixed to the vacuum vessel. In this manner a feed through is provided for one wire whilst maintaining a vacuum seal and providing electrical insulation between the vacuum vessel and the electrical signal.

In another field of high voltage isolation, U.S. Pat. No. 7,045,794 describes a stacked lens structure and a method of use thereof for preventing electrical breakdown. In the stacked lens structure, which comprises conductive layer and insulating layers between the conductive layers, recesses are made to increase the length of the breakdown path at surfaces where electrical breakdown is likely to occur. Furthermore, serrations may be formed in the recesses to further increase the surface breakdown path length. In another embodiment, silicon lenses are formed with cutouts. This solution relies on increasing the length of the surface breakdown path.

Other shielding designs are known from for example U.S. Pat. No. 5,117,117 and U.S. Pat. No. 4,176,901.

SUMMARY OF THE INVENTION

With the above described disadvantages of the known shielding designs, it is an objective of the current invention to provide a general solution to the above indicated various kinds of space and/or distance requirement at various, as above exemplified, high electric potential structures within otherwise low potential apparatuses or structures. In such circumstances and environments, electric creep or even electric breakdown in according to handbook-, at least practice-, solutions is counteracted by structure designs with abundance of mutual distance, at least of electric path length, between electric potential structure points that are negatively and positively charged with respect to one another, the electrodes therein traveling from the relative negative charged part to the other, relative positive charged, part. The known constructive solutions in this respect are specifically disadvantageous in a modern day charged particle lithography environment where very high potential structures are to be applied and where, different from what is known from the well known field of high voltage electric distribution, space is a critical design factor.

In providing a technical solution to the issues as described in the preceding, the invention encompasses at least one relatively negatively charged metal part that is at least partially encapsulated by the insulator, thereby preventing both electrical breakdown and electron creep to the positive pole. By encapsulating the metal part at negative potential, the electric field lines are forced into the encapsulating insulator, making both electrical breakdown and electron creep impossible.

An advantage of this novel design is that is greatly reduces space requirements of the shielding, without necessitating an increased mutual distance surface breakdown path. The principle solution provided here may be advantageously applied at various locations within charged particle type of lithography, however may as well favorably be applied in any high voltage application, i.e. also at other parts thereof than at a projection element. In the latter case, such as at high voltage vacuum feed-through, the feature of the second metal part being substantially thin will not apply. A reduction of space requirements is an advantage in space limited applications or applications where size limitations are not necessarily in place but where voluminous shielding arrangements are nevertheless undesirable. The latter being for instance vacuum vessels, where large openings in the vessel are to be avoided, whereas reduced radial distance is typically encountered in charged particle lens applications.

In summary, the invention relates to a high voltage shielding arrangement as described in attached claim 1, and to a charged particle lithography machine including such a shielding arrangement. The arrangement comprising a first metal part and a second metal part positioned at a distance of, preferably in close vicinity to, said first metal part. Said second metal part included in said arrangement to be set at an electrical potential causing a relatively negative charge with respect to the first metal part, for example by setting the electric potential of the second metal part to be lower than the electric potential of the first metal part. Said second metal part having comprising one or more edges and an insulator. The second metal part is at least partially encapsulated by the insulator facing the first metal part. Advantageous embodiments are described in the attached dependent claims.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will, by way of example, be further elucidated in the following embodiments of a charged particle optical system according to the current invention, in which.

In the figures, features having a corresponding structure or function are referred to by identical references.

DETAILED DESCRIPTION OF THE INVENTION

Figure 1:
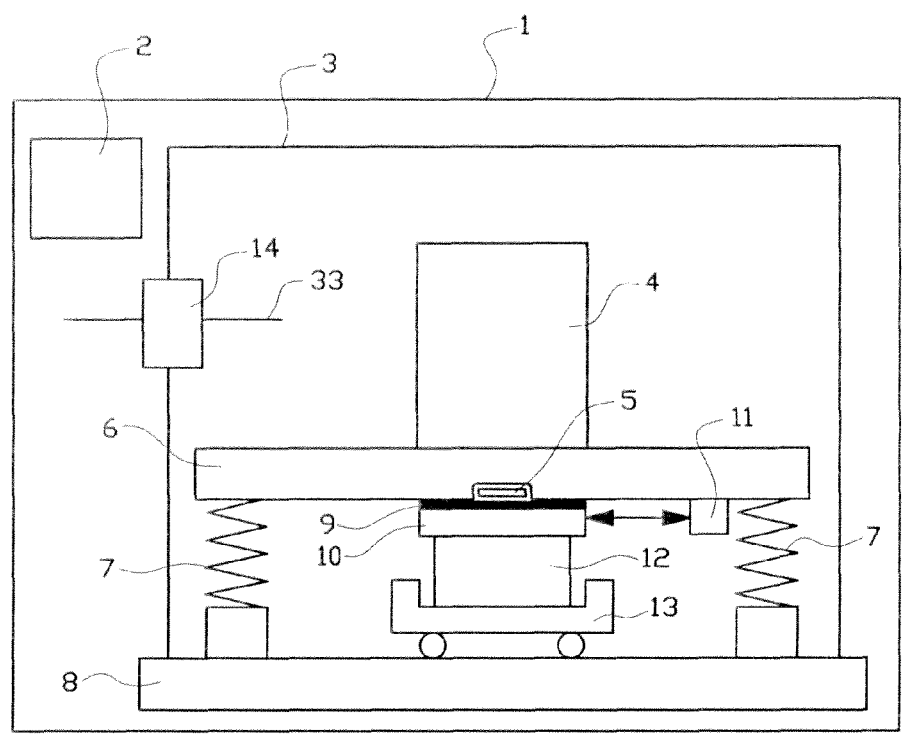
FIG. 1 illustrates a schematic representation of a known charged particle system including the wafer stage components.

FIG. 1 is a schematic representation of a prior art charged particle system 1 for projecting an image, in particular a control system provided image, onto a target. It includes the wafer stage components to which part of the present invention relates in particular. In this design the charged particle system comprises a control system 2, a vacuum chamber 3 mounted on the base frame 8, which contains the charged particle column 4, the metro frame 6 and the target positioning system 9-13. Said target 9 will generally be a wafer provided with a charged particle sensitive layer in the substrate plane. Target 9 is placed on top of wafer table 10, which are in turn place on chuck and long stroke drive 13. Measurement system 11 is connected to metrology frame 6 and provides measurements of the relative positioning of wafer table 10 and metro frame 6. The metro frame 6 typically is of relatively high mass and is suspended by vibration isolators 7 for example embodied by spring elements in order to dampen disturbances. The electron optical column 4 performs a final projection using projector 5. The projector 5 comprises a system of either electrostatic or electromagnetic projection lenses. In the preferred embodiment as depicted the lens system comprises an array of electrostatic charged particle lenses.

Projector 5 is positioned ultimately close to target 9. To achieve said required accuracy over a large range of motion, the wafer positioning system typically comprises a long stoke component 13 for moving the wafer stage over a relatively large distance in the scanning direction and perpendicular to the scanning direction, and a short stroke component 12 for accurately performing the positioning of the target 9 and for correcting for disturbances. Relative positioning of the wafer stage with regard to the metro frame 6 is measured by measurement system 11. Target 9 is clamped onto the wafer table 10 to ensure the fixation of the target 9 during projection.

The system comprises a plurality of vacuum feedthroughs 14 for allowing electrical wires 33 to pass through the wall of the vacuum vessel. Wire 33 can signals for example from the control system 2 or power to the charged particle column 4. Both signal and power can be set at high voltage potential in the range from 1 kV to 10 kV at negative and positive potential.

Figure 2:
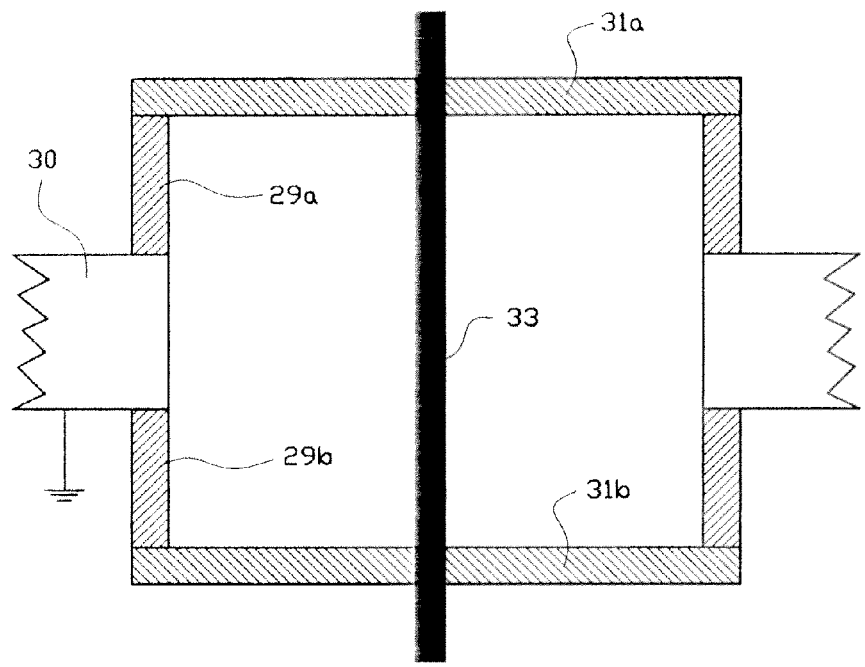
FIG. 2 illustrates a cross section of an embodiment of a commonly known high voltage shielding arrangement for use in lithography.

FIG. 2 shows a cross section of a known construction in a lithography environment for use as a vacuum feed through. In the known feed through flange signal wire 33 is fed through an external metal carrier 31a and an internal metal carrier 31b for providing a signal connection into a vacuum chamber 30. Vacuum chamber 30 is included at ground potential whereas the shielding of signal wire 33 operates at high voltage potential. To prevent flashover between metal carriers 31a and 31b and signal wire 33 insulators 29a and 29b are included. Care must be taken to provide a large enough spatial distance between vacuum chamber 30 and metal carriers 31a and 31b. Said required spatial distance leads to significant intrusions both into the vacuum chamber and on the external face of the vacuum chamber.

Figure 3:
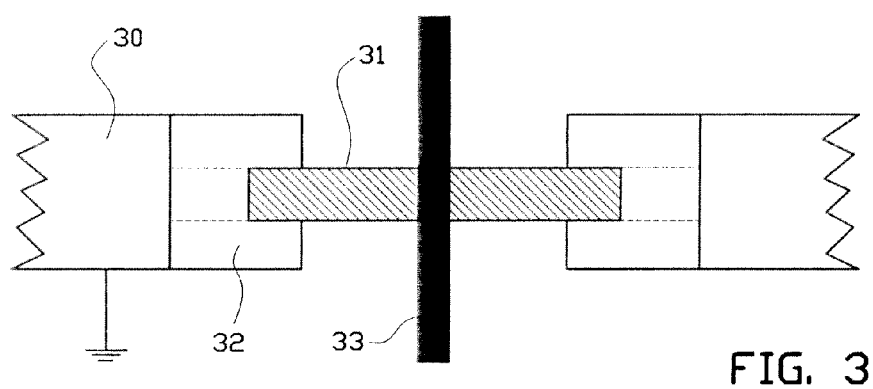
FIG. 3 illustrates a cross section of a first embodiment and application of the high voltage shielding in the form of a vessel wall part provided with a feed through flange adapted in accordance with the present invention.

FIG. 3 shows a cross section of a wall part of the system according to FIG. 1, provided with a feed through flange adapted in accordance with the present invention as an embodiment wherein the high voltage shielding design is included in a high voltage shielding vacuum feedthrough flange. A signal wire 33 is fed through a metal carrier 31 for providing a signal connection through the wall of a vacuum chamber.

The carrier is partially encapsulated by an insulator 32 facing a second metal part 30. Insulator 32 can be moulded during manufacturing partially encapsulating metal carrier 31. Alternatively, the insulator can be constructed around metal carrier 31 by constructing the insulator from several layers, as indicated in FIG. 3, thus partially encapsulating the metal carrier. By encapsulating preferably both edges of the metal carrier with the insulator electron creep and electrical breakdown are prevented due to the encapsulation of the emission tips formed by the edges of the carrier. In other charged particle embodiments such potential differences may be up to 50 kV.

The second metal part serves as the connection between the flange and the vacuum chamber. The flange is airtightly connected to the vacuum chamber. Because of the isolator between the metal carrier at high voltage and the metal flange the flange can still be set at ground potential ensuring safe operation. The partial encapsulation of the metal carrier allows for reducing the overall diameter of the feedthrough flange.

Figure 4:
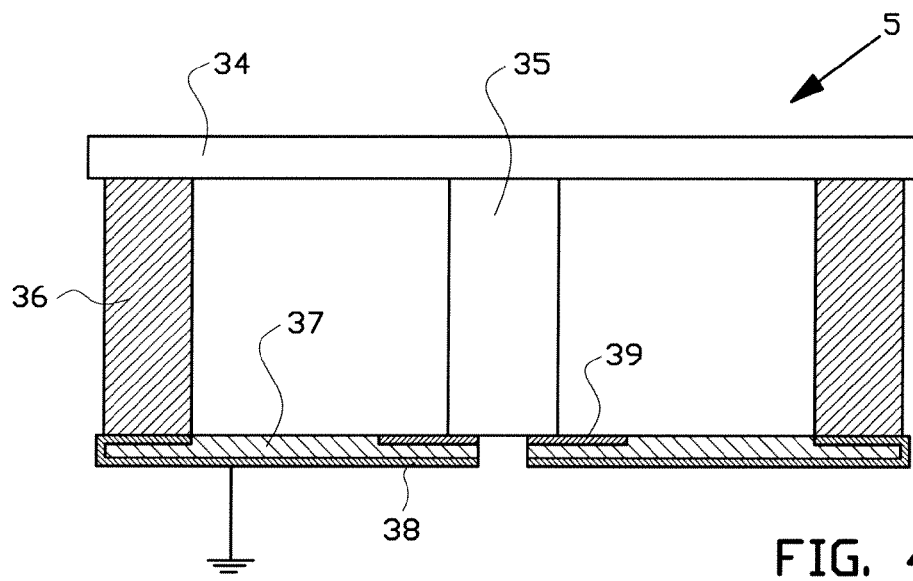
FIG. 4 illustrates a cross section of an embodiment of a charged particle projection lens arrangement for use in lithography.

In FIG. 4 a cross section of a construction is shown for a charged particle lens application. A thin metal coating 39 is partially included on an insulating carrier and set at high voltage and is in electrical contact with the lens stack 35. A thin second metal coating 38 also partially included on said insulating carrier is set at ground potential and is in electric contact with the projection lens housing 36. The projection lens housing combined with an insulating top cover 34 encloses the complete projection lens arrangement. To prevent electric flashover or electrical breakdown between metal coating 39 and lens housing 36 a significant gap must exist between metal coating 39 and lens housing 36. Otherwise, electrons are likely to emit from the sharp edge of metal coating 39 when metal coating 39 is set at negative potential.

Figure 5:
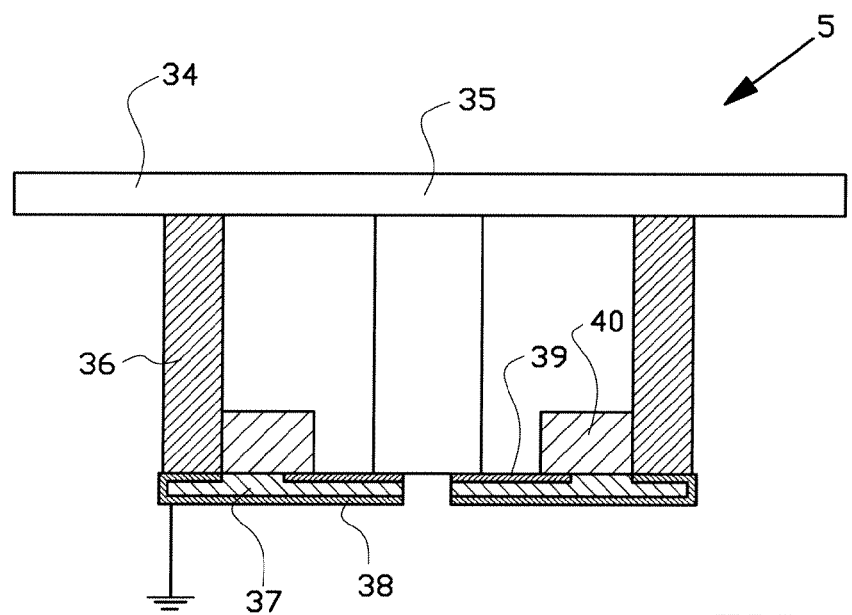
FIG. 5 illustrates a cross section of shows a second embodiment and application of the high voltage shielding in the form of a lens structure also adapted in accordance with the present invention.

In FIG. 5 a cross section of another embodiment of the present invention is shown wherein the high voltage shielding design is included in projection lens 5 in the charged particle lithography system. A thin metal coating 39 is partially included on an insulating carrier 37 and set at high voltage and is in electrical contact with the lens stack 35. A thin second metal coating 38 also partially included on said insulating carrier is set at ground potential and is in electric contact with the projection lens housing 36. The projection lens housing combined with an insulating top cover 34 encloses the complete projection lens arrangement.

In the embodiment the first metal coating and the second metal coating are included in relative close proximity of one another. To prevent electron creep and electrical breakdown an isolator 40 is included for partially encapsulating the first metal coating such that the area in close proximity to the second metal coating is encapsulated, thus preventing electrons to escape from the emission tip formed by the edge of coating. This embodiment ensures that different parts of the projection lens can be set at different potentials and ground potential, without the need for large spacing between the parts at high voltage and ground potential.

It is to be understood that the above description is included to illustrate the operation of the preferred embodiments and is not meant to limit the scope of the invention. Apart from the concepts and all pertaining details as described in the preceding, the present invention relates to all features as defined in the following set of claims, as well as to all details in the annexed figures as may directly and unambiguously be derived by one skilled in the art. For as far as reference numbers are included in the claims, these are solely included for indicating an exemplarily meaning, thus not limiting the preceding term, and for that reason included in brackets.

The invention claimed is:

1. A projection lens (5) for use in a charged particle system, said projection lens comprising:
   a first metal part (36) in the form of a projection lens housing of said projection lens, having an outer wall to be set at an electrical potential;
   a lens stack (35);
   a substantially thin second metal part (39) in electrical contact with said lens stack (35);
   said second metal part (39) included in said projection lens (5) and to be set at an electrical potential that is lower than the electric potential of the first metal part (36);
   said second metal part (39) positioned at a distance to said first metal part (36) and comprising one or more edge parts;
   said distance between said first and second metal parts defining a discharge region in which an electric field is present;
   said projection lens further comprising an insulator (40);
   said discharge region being arranged in the plane of the second metal part (39), wherein said one or more edge parts facing the discharge region are encapsulated by the insulator (40), and the second metal part (39) being included as a conductive coating.

2. A projection lens (5) according to claim 1, further comprising
   an insulating carrier (37) provided with a conductive coating (38) on the outer edge thereof, which conductive coating (38) is in contact with the projection lens housing (36),
   wherein said second metal part (39) is included as a circular conductive coating on a central part of the insulating carrier (37), and
   wherein the insulator (40) is included as a ring placed on and fully covering the outer edge of the second metal part (39).

3. A charged particle lithography system for projecting an image onto a target, said system comprising an electron optical column (4), said electron optical column comprising:
   a projection lens (5) comprising a projection lens stack (35); and
   a high voltage shielding arrangement comprising
      a first metal part (36) forming a projection lens housing of said projection lens, wherein said first metal part is to be set at a first electrical potential,
      a substantially thin second metal part (39) to be set at a second electrical potential causing a relatively negative charge with respect to the first metal part (36), said second metal part being arranged within said projection lens housing and comprising one or more edge parts;

wherein said second metal part (39) is positioned at a distance to said first metal part (36) defining a discharge region in which an electric field is present;

wherein in said high voltage shielding arrangement further comprises an electrical insulator, wherein said discharge region is arranged in the plane of the second metal part (39), wherein said one or more edge parts facing the discharge region are encapsulated by said insulator (40), and wherein the second metal part (39) is included as a conductive coating.

4. A charged particle lithography system according to claim 3, wherein said projection lens (5) comprises a system of either electrostatic or electromagnetic projection lenses.

5. A charged particle lithography system according to claim 3, wherein the relative electric potential difference between the first and second metal parts is in the range of 1 kV to 10 kV.

6. A charged particle lithography system according to claim 3, wherein the electric field strength in the discharge area is in the range of 10 kV/mm to 30 kV/mm.

7. A charged particle lithography system according to claim 3, wherein the high voltage shielding arrangement prevents electric breakdown and/or electron creep.

8. A charged particle lithography system according to claim 3, wherein the first metal part is set at ground potential.

9. A charged particle lithography system according to claim 3, further comprising an insulating top cover (34), wherein said projection lens housing and said top cover enclose the complete projection lens arrangement.

10. A charged particle lithography system according to claim 3, further comprising:

a circular insulating carrier (37) provided with a conductive coating (38) on the outer edge thereof, which conductive coating (38) is in contact with the projection lens housing (36), wherein said second metal part (39) is included as a circular conductive coating on a central part of the circular insulating carrier (37).

11. A charged particle lithography system according to claim 3, wherein said second metal part (39) is in electrical contact with said lens stack (35).

12. A charged particle lithography system according to claim 3, wherein the insulator (40) is included as a ring placed on and fully covering the outer edge of the second metal part (39).

* * * * *